(12) United States Patent
Jin et al.

(10) Patent No.: US 7,795,118 B2
(45) Date of Patent: Sep. 14, 2010

(54) GALLIUM NITRIDE BASED COMPOUND SEMICONDUCTOR DEVICE INCLUDING COMPLIANT SUBSTRATE AND METHOD FOR MANUFACTURING THE SAME

(75) Inventors: Yong Sung Jin, Seoul (KR); Jae Hak Lee, Seoul (KR)

(73) Assignee: Theleds Co., Ltd., Yongin-si, Gyeonggi-do (KR)

( * ) Notice: Subject to any disclaimer, the term of this patent is extended or adjusted under 35 U.S.C. 154(b) by 230 days.

(21) Appl. No.: 11/989,008

(22) PCT Filed: Jul. 21, 2006

(86) PCT No.: PCT/KR2006/002892

§ 371 (c)(1),
(2), (4) Date: Jan. 18, 2008

(87) PCT Pub. No.: WO2007/011193

PCT Pub. Date: Jan. 25, 2007

(65) Prior Publication Data

US 2009/0261345 A1 Oct. 22, 2009

(30) Foreign Application Priority Data

Jul. 21, 2005 (KR) .................. 10-2005-0066122

(51) Int. Cl.
*H01L 21/20* (2006.01)
*H01L 21/36* (2006.01)
*H01L 31/0256* (2006.01)

(52) U.S. Cl. .............. 438/478; 438/616; 438/584; 257/E21.09

(58) Field of Classification Search ............ 257/76, 257/E21.09, E29.102, 79, 86, 103; 438/478, 438/481, 483, 496, 584, 616
See application file for complete search history.

(56) References Cited

U.S. PATENT DOCUMENTS

| 6,057,564 A * | 5/2000 | Rennie ................ 257/99 |
| 2004/0123796 A1* | 7/2004 | Nagai et al. ............ 117/103 |
| 2005/0122027 A1* | 6/2005 | Aiba et al. ............. 313/483 |

FOREIGN PATENT DOCUMENTS

JP 10-215000 * 11/1998

* cited by examiner

*Primary Examiner*—Thomas L Dickey
*Assistant Examiner*—Nikolay Yushin
(74) *Attorney, Agent, or Firm*—The Nath Law Group; Jerald L. Meyer; Sung Yeop Chung (57) ABSTRACT

A gallium nitride based compound semiconductor device including a compliant substrate having a reduced stress and a method for manufacturing the same are disclosed. The compliant substrate included in the gallium nitride based compound semiconductor device is manufactured by heating a substrate and a group III metal including at least one of an aluminum, a gallium and an indium, and a chloride based compound generated by introducing a HCl gas to the melted group III metal reacts with a NH3 gas to form a nitride based thin film on the wafer.

2 Claims, 7 Drawing Sheets

GALLIUM NITRIDE BASED COMPOUND SEMICONDUCTOR DEVICE INCLUDING COMPLIANT SUBSTRATE AND METHOD FOR MANUFACTURING THE SAME

TECHNICAL FIELD

The present invention relates to a compliant substrate, a gallium nitride based compound semiconductor device including a compliant substrate and a method for manufacturing the same. More particularly, the present invention relates to a gallium nitride based compound semiconductor device including a compliant substrate and a method for manufacturing the same having a reduced manufacturing time and an improved work efficiency.

BACKGROUND ART

Generally, an AlGaInN, which is a gallium nitride based compound semiconductor including a small amount of an indium added thereto, is widely used for an active layer of a blue laser diode or a blue LED (light emitting diode).

A 2-step MOVPE (metal organic vapor phase epitaxy) is a general method for controlling a growth of an AlGaInN crystal. In accordance with the method, the AlGaInN crystal is grown to a thickness of tens of nanometer (nm) on a sapphire substrate at a low temperature ranging approximately from 400 to 900° C., and the AlGaInN crystal is further grown at a high temperature of approximately 1,050° C.

When an AlGaInN buffer layer is formed on a sapphire wafer at the low temperature, a planar thin film having a polycrystalline characteristic is formed. When the temperature is raised and the thin film is subjected to an optimal heat treatment at the high temperature, a column of the AlGaInN crystal is formed. The AlGaInN crystal grows in a lateral direction in a planar fashion at the high temperature based on the AlGaInN crystal. After the AlGaInN crystal is grown to a certain thickness, the AlGaInN crystal of a single crystal having a relatively smooth surface is obtained. A condition of the heat treatment of the buffer layer is dependant upon the growth of the buffer layer and the thickness thereof.

However, the process for forming the buffer layer is carried out within a MOCVD (metal organic chemical vapor deposition) process such that a time required to carry out the MOCVD process is prolonged. Particularly, as the time to carry out the MOCVD process is prolonged, a run time of a MOCVD reactor necessary for fabricating a device is significantly prolonged. In addition, the buffer layer during the grown thereof cannot be estimated and a throughput of the MOCVD process is reduced.

DISCLOSURE

Technical Problem

It is an object of the present invention to provide a gallium nitride based compound semiconductor device including a compliant substrate.

It is yet another object of the present invention to provide a method for manufacturing a gallium nitride based compound semiconductor device.

Technical Solution

There is provided a method for manufacturing a GaN based compound semiconductor device, comprising: providing a compliant substrate including a sapphire wafer and a $(Al_xGa_{1-x})_yIn_{1-y}N$ film on the sapphire substrate, the compliant substrate having a relived stress characteristic, where $0 \leq x \leq 1$, and $0 \leq y \leq 1$; forming a first GaN layer, an active layer, and a second GaN layer on the complaint substrate in sequence; forming a current spreading layer on the second GaN layer; removing a portion of the second GaN layer and a portion of the active layer to expose the first GaN layer corresponding to an n-type contact; removing a predetermined thickness of the exposed first GaN layer; forming a first electrode on the exposed first GaN layer; and forming a second electrode on the current spreading layer.

ADVANTAGEOUS EFFECTS

In accordance with the present invention, a GaN based device may be manufactured directly on the AlGaInN compliant substrate without growing the buffer layer on the sapphire substrate necessarily for the MOCVD process in order to grow a high quality epitaxial layer, thereby reducing the total process time of the MOCVD process.

DESCRIPTION OF DRAWINGS

The above and other advantages of the present invention will become more apparent by describing in detail exemplary embodiments thereof with reference to the accompanying drawings, in which.

BEST MODE

It should be understood that the exemplary embodiments of the present invention described below may be varied and modified in many different ways without departing from the inventive principles disclosed herein, and the scope of the present invention is therefore not limited to these particular following embodiments. Rather, these embodiments are provided so that this disclosure will be through and complete, and will fully convey the concept of the invention to those skilled in the art by way of example and not of limitation.

Hereinafter, the present invention will be described in detail with reference to the accompanying drawings. In the drawings, the width or thickness of certain layers (or films) and regions may be exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A GaN based compliant substrate in accordance with the present invention includes a structure wherein a GaN based thin film is stacked on a sapphire wafer. A HVPE (hybrid vapor phase epitaxy) process may be used to control a growth of the GaN based thin film.

Figure 1:
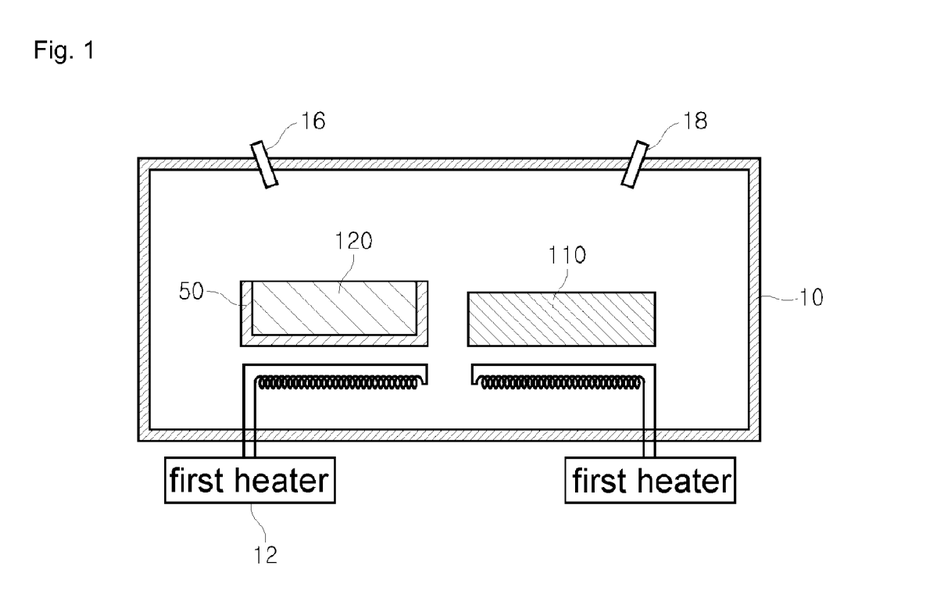
FIGS. 1 through 3 are schematic diagrams illustrating a method for manufacturing a compliant substrate according to a first embodiment of the present invention.

First, as shown in FIG. 1, the GaN based thin film is grown on the sapphire wafer using the HVPE process or a MOCVD (metal organic chemical vapor deposition) process. Preferably, a thickness of the GaN based thin film may range from 10 to 200 nm approximately and the GaN based thin film may be grown at a temperature ranging from 300 to 900° C. approximately.

First Embodiment

Figure 2:
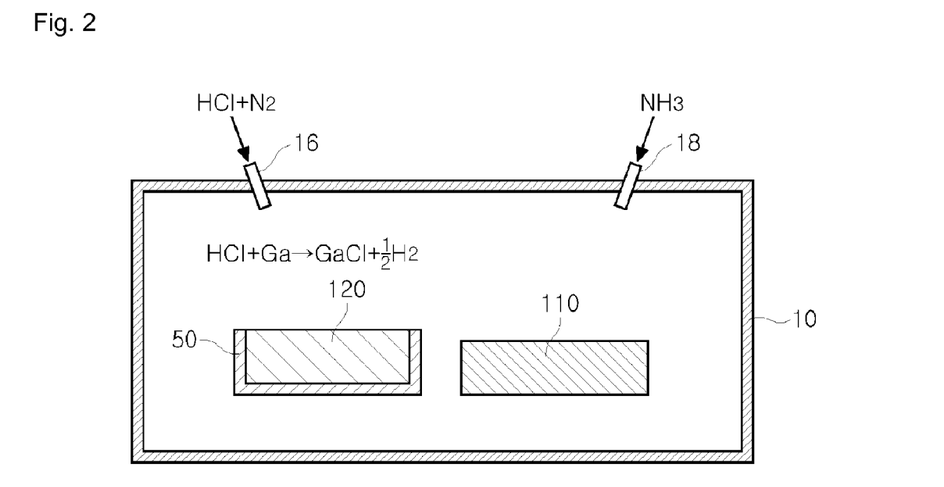
Figure 3:
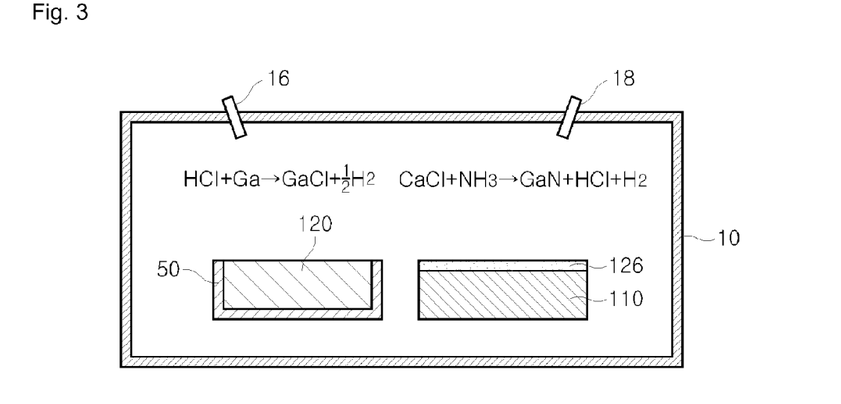

FIGS. 1 through 3 are schematic diagrams illustrating a method for manufacturing a compliant substrate according to a first embodiment of the present invention. The term "compliant substrate" refers to a substrate capable of an expansion and a contraction according to a lattice constant of an epitaxial material such that any crystal may be grown thereon. While a gallium is exemplified in FIGS. 1 through 3 as a group III metal, the gallium is only for an illustrative purpose. Any of the group III metals such as aluminum or an indium may be utilized instead of the gallium. Hereinafter, for the illustrative purposes, the description of the embodiments will be made particularly for the gallium.

First, referring to FIG. 1, a sapphire wafer 110 and a gallium 120 having a purity of at least 99.999% are placed in a process chamber 10. As shown in FIG. 1, the gallium 120 is placed on the sapphire wafer 110. The gallium 120 is then heated to approximately 900° C. using a crucible 50 and the sapphire wafer 110 is heated to approximately 550° C. in order to grow a GaN layer.

Next, as shown in FIG. 2, a HCL gas is supplied on the melted gallium 120 through a first inlet 16 to produce a GaCl compound GaCl+½H$_2$. The GaCl compound is used as a source of the gallium in a GaN. An N$_2$ gas is used as a carrier gas of the HCl gas and an NH$_3$ gas supplied through a second inlet 18 is used as a source of a nitrogen in the GaN.

As illustrated in FIG. 3, as the GaCl compound is produced, the NH$_3$ gas is supplied through the second inlet 18 of the process chamber 10 to produce the GaN.

Referring to FIG. 3, when the GaCl compound and the NH$_3$ gas contact the sapphire wafer 110, a thermal chemical reaction GaCl+NH$_3$→GaN+HCl+H$_2$ occurs such that a GaN thin film 126 is formed on the sapphire wafer 110. A ratio between the NH$_3$ gas and the HCl gas is approximately 30:1, and a growth rate of the GaN thin film 126 is approximately 25 μm per hour, which is about ten times faster than that of the MOCVD process offering a greatly improved work efficiency.

As described above, the HVPE process may be used to grow the GaN based compound. However, it should be noted that the MOCVD process or a sputtering process may also be used to grow the GaN based compound.

While a sapphire used a base of the compliant substrate, one of a silicon, a gallium arsenide, a aluminum arsenide, a silicon carbide, a quartz, a glass and a ZnO may also be utilized.

MODE FOR INVENTION

Figure 4:
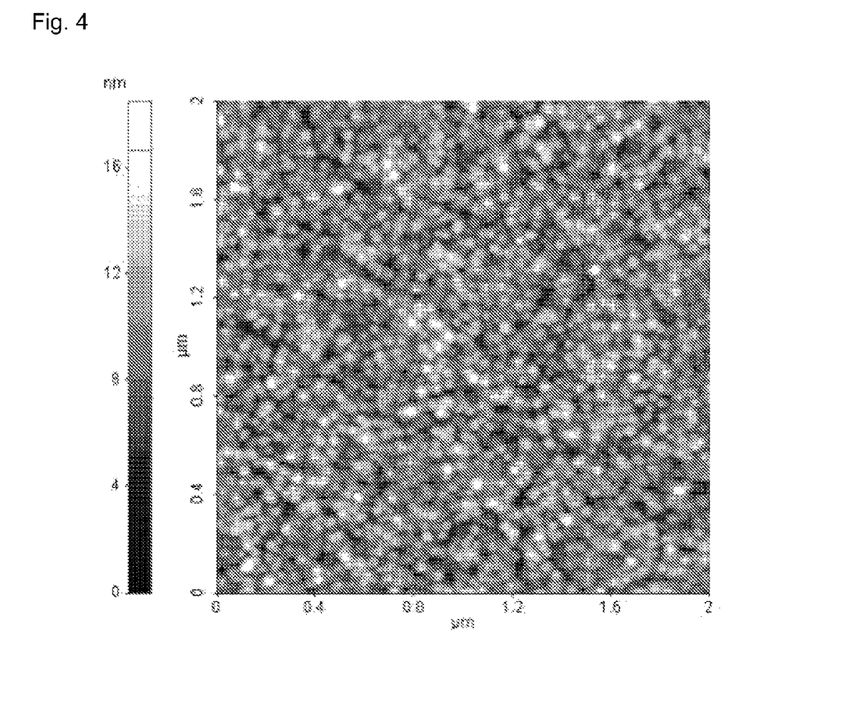
FIG. 4 is an AFM (atomic force microscopy) profile of a surface of a GaN based compliant substrate grown using a HVPE (hybrid vapor phase epitaxy) process.

A result of a measurement of a surface of the compliant substrate manufactured by the above-described method is shown in FIG. 4.

FIG. 4 is an AFM (atomic force microscopy) profile of the surface of the GaN based compliant substrate that is grown using the HVPE process.

Referring to FIG. 4, a roughness average (Ra) of the surface of the GaN based compliant substrate is approximately 1.84 nm, which shows that the surface is planar.

Figure 5:
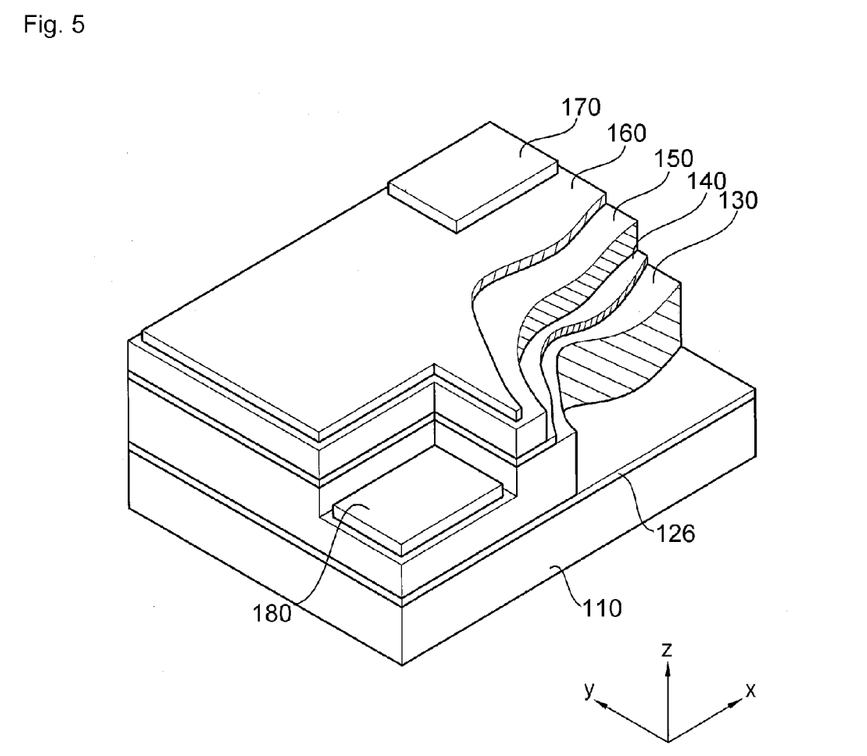
FIG. 5 is a perspective view illustrating a GaN based compound semiconductor device according to the first embodiment of the present invention.
Figure 6:
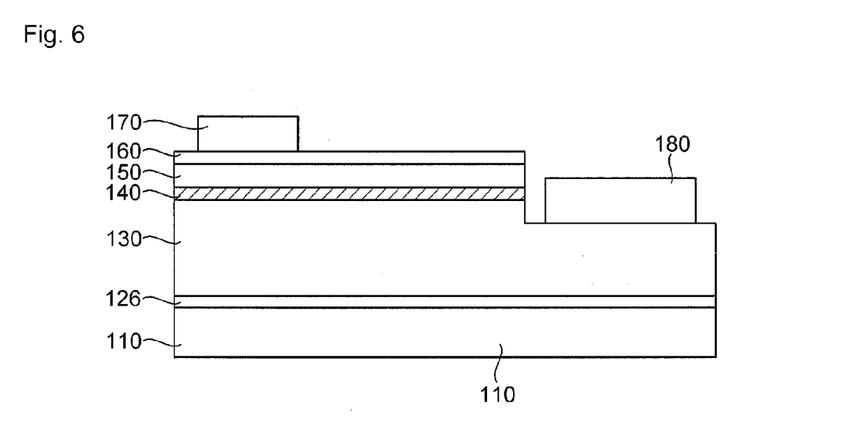
FIG. 6 is a cross-sectional view illustrating the semiconductor device shown in FIG. 5.

FIG. 5 is a perspective view illustrating a GaN based compound semiconductor device according to the first embodiment of the present invention. FIG. 6 is a cross-sectional view illustrating the semiconductor device in FIG. 5. Specifically, the semiconductor device is a GaN based compound light emitting device manufactured using the compliant substrate produced by the method according to the first embodiment of the present invention.

Referring to FIGS. 5 and 6, the GaN based compound semiconductor device in accordance with the first embodiment of the present invention, the GaN based compound light emitting device in particular, includes a sapphire wafer 110, a GaN based thin film 126, an n-type GaN layer 130, an active layer 140, a p-type GaN layer 150, a current spreading layer 160, an n-electrode 180 and a p-electrode 170. For an illustrative purposes, in FIG. 5, a portion of the GaN based compound semiconductor device is cut to expose a portion of the GaN based thin film 126. The sapphire wafer 110 and the GaN based thin film 126 formed thereon define a compliant substrate having a reduced stress.

In operation, a current flows through the n-electrode 170 and the p-electrode 180 to cause a recombination of an electron and a hole at the active layer 140 that emits a light.

Generally, the MOCVD process, an MBE (molecular beam epitaxy) process, the HVPE process are used to grow the n-type GaN layer 130 or the p-type GaN layer 150. Any type of the GaN based compound may be used as long as a condition of $(Al_xGa_{1-x})_yIn_yN$ ($0 \leq x \leq 1$, $0 \leq y \leq 1$) is satisfied.

The GaN thin film 126 is formed on the sapphire wafer 110 to accelerate the growth of the n-type GaN layer 130.

The n-type GaN layer 130, the active layer 140 and the p-type GaN layer 150 are grown on the GaN thin film 126 in sequence. Generally, in order to produce a current in a p-n junction diode, an electrode is formed between an upper portion of the p-type GaN layer 150 and a lower portion of the substrate that is electrically connected to the n-type GaN layer 130.

However, since the sapphire wafer 110 used for a GaN based diode is an insulator, an electrode cannot be formed on the sapphire wafer 110. Therefore, an electrode is formed on the n-type GaN layer 130.

Accordingly, portions of the p-type GaN layer 150, the active layer 140 and the n-type GaN layer 130 are removed and the n-electrode 180 is formed on an exposed portion of the n-type GaN layer 130. Therefore, the n-type GaN layer 130 has a first height in a first region of the GaN based thin film 125 and has a second height in a second region of the GaN based thin film 125, wherein the first height is larger than the second height.

Since the light is emitted from a surface of a p-n junction, the p-type electrode 170 is formed on an edge portion of the current spreading layer 160 such that the p-type electrode 170 does not block the light.

When both the n-electrode 180 and the p-electrode 170 are positioned on a top portion of the device, a current may not spread uniformly compared to a general diode structure wherein the n-electrode 180 and the p-electrode 170 are placed on different surfaces in parallel to each other.

In addition, since the p-type GaN layer 150 has a resistance generally greater than that of the n-type GaN layer 130, a current through the p-type GaN layer 150 may not flow uniformly. The current spreading layer 160, which is a thin transparent electrode, is formed on an entirety of a top surface of the p-type GaN layer 150 so that the current may flow through the top surface of the p-type GaN layer 150.

While the n-type GaN layer 130 exemplifies a GaN based semiconductor layer formed on the GaN based thin film layer 126, the p-type GaN layer formed on the GaN based thin film layer 126 may be used as GaN based semiconductor layer. Accordingly, the active layer, the n-type GaN layer and the current spreading layer may be formed on the p-type GaN layer. The p-electrode may be formed on a portion of the current spreading layer, and the n-electrode may be formed on an exposed portion of the n-type GaN layer.

FIGS. 7 through 12 are schematic views illustrating a method for manufacturing the semiconductor device of a light emitting device shown FIG. 6.

Figure 7:
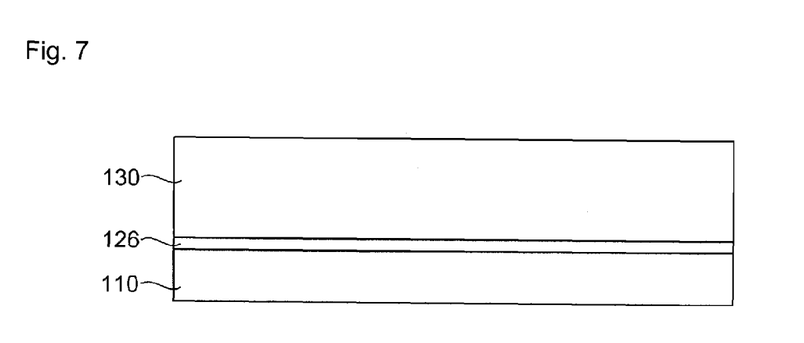
FIGS. 7 through 12 are schematic views illustrating a method for manufacturing the semiconductor device of a light emitting device shown FIG. 6.

Referring to FIG. 7, the n-type GaN layer 130 for the GaN based light emitting device is formed on the compliant substrate wherein the GaN thin film 126 is disposed on the sapphire wafer 110 by injecting a tri-methyl-gallium (TMGa) and an ammonia ($NH_3$) gas using a $H_2$ gas as a carrier gas.

Figure 8:
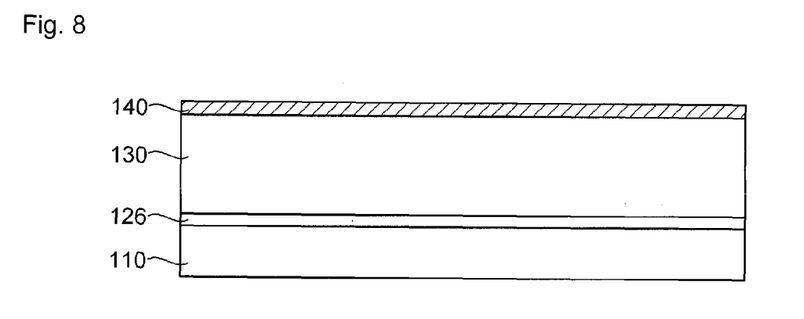
Figure 9:
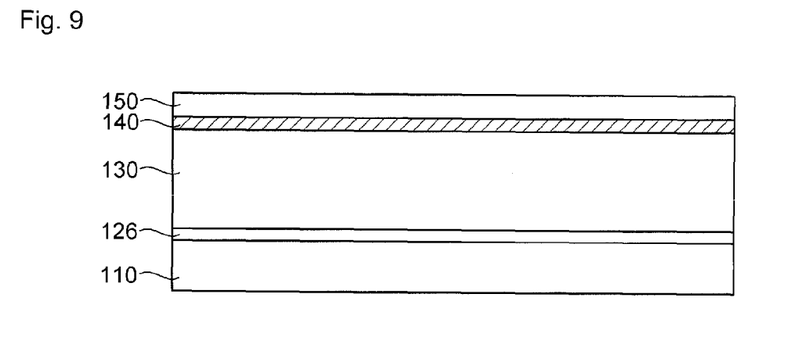
Figure 10:
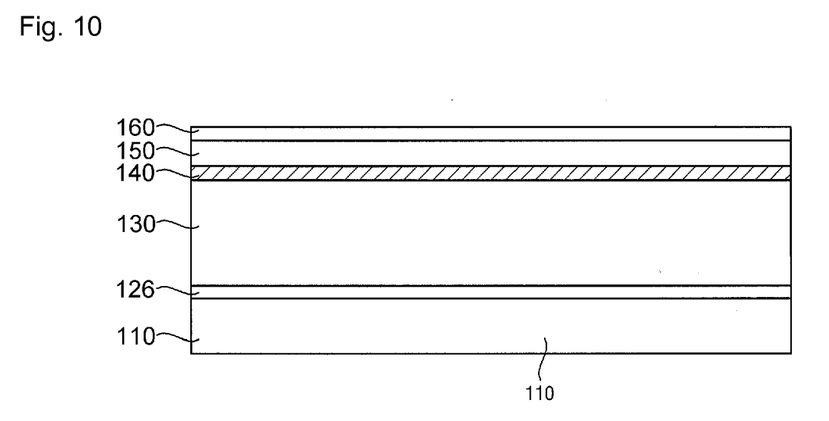

Referring to FIGS. 8 through 10, the active layer 140, a multi quantum well (MQW) for instance, and the p-type GaN layer 150 are sequentially formed on the compliant substrate using the MOCVD process.

Thereafter, the current spreading layer 160 being in an ohmic contact with the p-type GaN layer 150 is formed thereon. Preferably, the current spreading layer 160 includes a transparent oxide electrode such as indium tin oxide (ITO) or antimony tin oxide (ATO) formed by an evaporation process or the sputtering process. More preferably, a super lattice structure (SLS) may be introduced to the p-type GaN layer 150 to form a tunnel junction because the ohmic contact between the ITO and the p-type GaN layer 150 is difficult to form.

Figure 11:
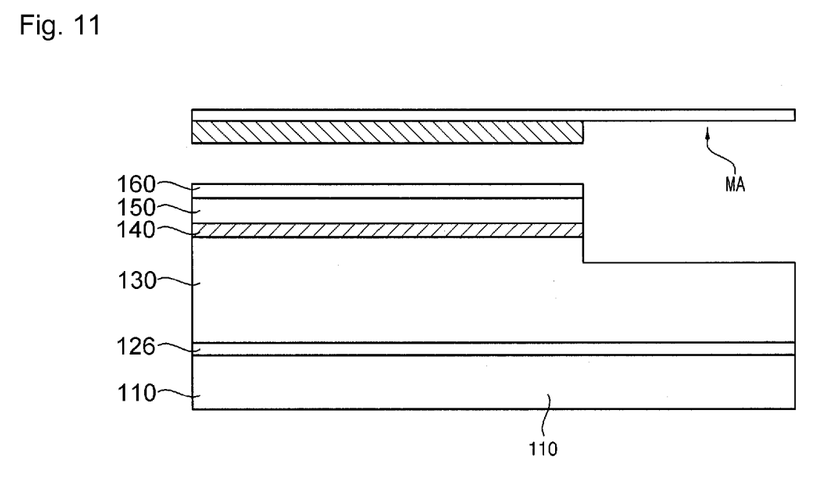

Referring to FIG. 11, a portion where an n-contact is to be formed is subjected to a mesa etching using a mask or a reticle. Accordingly, the n-type GaN layer 130 has the first height in the first region of the compliant substrate and has the second height smaller than the first height.

Figure 12:
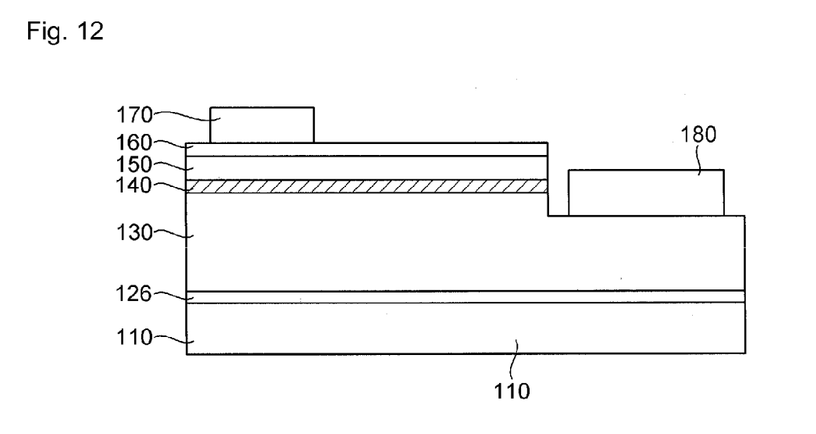

Referring to FIG. 12, a Cr/Ni/Au layer is deposited on an edge portion the current spreading layer 160 which is a relatively higher region to define the p-electrode 170. In addition, a Ti/Al/Ti/Au layer or a Cr/Ni/Au layer is deposited on the etched portion n-type GaN layer 130 which is a relatively lower region to define the n-electrode 180.

The embodiment wherein a light emitting diode of a top emission type including the current spreading layer 160 consisting of the transparent material mounted on the p-type GaN layer 150 is described. The light emitting diode of the top emission type is assembled using a wire bonding to emit the light in a forward direction.

However, it should be noted that the present invention can also applied to a light emitting diode of a bottom emission type wherein a p-type contact layer having a higher reflectivity is disposed on the p-type GaN layer 150 to form an ohmic contact with the p-type GaN layer 150. The light emitting diode of the bottom emission type is assembled using a flip chip bonding to emit a light in a reverse direction. The p-contact layer comprises a Ni/Ag layer, a Ni/Al layer or a Pt/Ag layer and is formed by the evaporation process or the sputtering process. In order to enhance a light extraction efficiency of the light emitted through the sapphire wafer, the sapphire wafer may have an uneven back surface.

When the GaN layer is formed directly on the sapphire wafer, a crystal of the sapphire wafer becomes a seed crystal, and a GaN based crystal layer grows to have a shape of a hexagonal pillar along a hexagonal crystal structure of the sapphire wafer. In such case, a surface of the crystal layer becomes exceedingly rough. The roughness of the surface may greatly deteriorate a characteristic of the light emitting device. However, in accordance with the present invention, the compliant substrate the GaN thin film having a very smooth surface having the n-type GaN layer or the p-type GaN layer formed thereon to reduce a possibility of a rough surface may be reduced. Therefore, the light emitting device such as the light emitting diode having an enhanced efficiency may be implemented.

Second Embodiment

Figure 13:
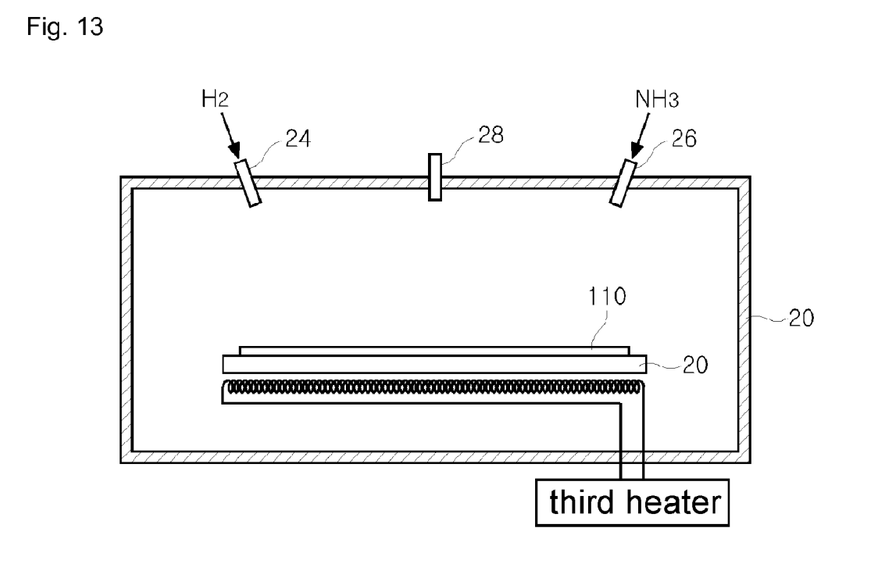
FIGS. 13 and 14 are schematic views illustrating a method for manufacturing a compliant substrate according to a second embodiment of the present invention.
Figure 14:
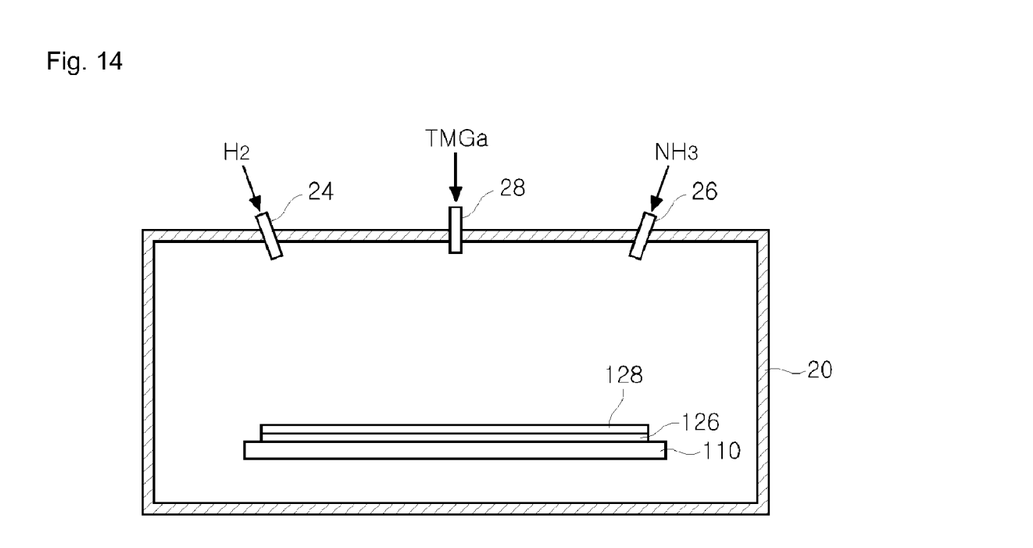

FIGS. 13 and 14 are schematic views illustrating a method for manufacturing a GaN based compliant substrate according to a second embodiment of the present invention. Particularly, the second embodiment exemplifies a process wherein a GaN layer is formed on the GaN based compliant substrate at a high temperature to illustrate an applicability of the compliant substrate.

Referring to FIG. 13, the compliant substrate having a GaN thin film 126 formed on a sapphire wafer 110 via a HVPE process is placed in a MOCVD reactor 20. A $H_2$ gas and an $NH_3$ gas are supplied through first and second inlets 24 and 26, respectively. A temperature of the MOCVD reactor 20 is elevated to 1050° C. and the temperature s maintained for approximately five minutes. Preferably, flow rates of the $H_2$ gas and the $NH_3$ gas are 30 liter/min and 6 liter/min, respectively. The temperature is elevated and maintained by a third heater.

Referring to FIG. 14, while supplying of the $H_2$ gas and the $NH_3$ gas through the first and second inlets 24 and 26, respectively, a tri-methyl-gallium (TMGa), which is to be stacked on a GaN wafer, is supplied through a third inlet 28 to form a GaN layer 128. A growth rate of the GaN layer 128 is measured to be 2.5 μm/hour. The GaN layer 128 constitutes a GaN based light emitting device structure.

A crystalline characteristic and an optical characteristic of the GaN layer grown by the above-described process are shown in Table 1.

TABLE 1

| DCXRD rocking curve FWHM (arcsec) | | PL characteristic at room temperature | |
|---|---|---|---|
| (002) diffraction | (302) diffraction | PL Peak wavelength(nm) | PL FWHN(nm) |
| 300 | 500 | 362 | 4 |

As shown in Table 1, an X-ray diffraction (XRD) of a rocking curve is measured to verify the crystalline characteristic of the GaN layer. For a (002) diffraction, a full width at half maximum (FWHM) of the XRD is measured at approximately 300 arcsec, and for a (302) diffraction, the FWHM is measured at approximately 500 arcsec.

In addition, as shown in Table 1, the GaN layer has an enhanced optical characteristic since a peak value of a photoluminescence (PL) is 362 nm and the FWHM of a light emitting spectrum is 4 nm.

As described above, the GaN layer grown according to the embodiments of the present invention has an improved crystalline characteristic and optical characteristic.

Figure 15:
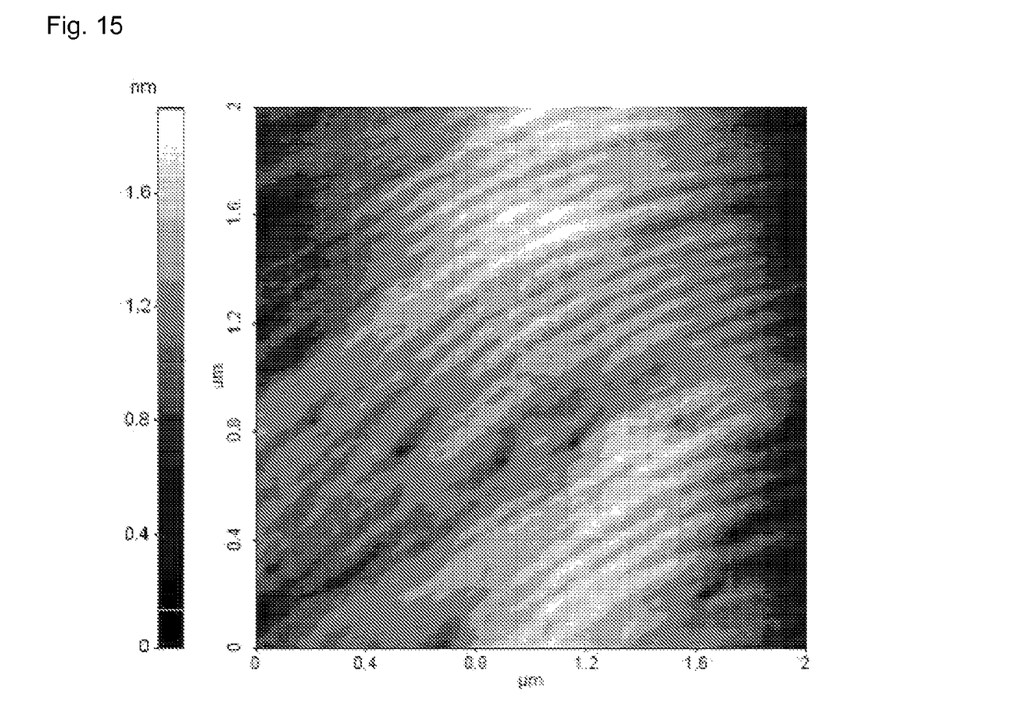
FIG. 15 is an AFM photograph of a surface of GaN having a thickness of 2 μm grown at a high temperature.

In addition, as shown in FIG. 15, the Ra value of the surface of the GaN layer, which is measured by the atomic force microscopy (AFM), is 0.25 nm indicating that the surface of the GaN layer is very smooth.

Having described the exemplary embodiments of the present invention and its advantages, it is noted that various changes, substitutions and alterations can be made herein without departing from the spirit and scope of the invention as defined by appended claims.

INDUSTRIAL APPLICABILITY

As descried above, according to the present invention, the GaN based semiconductor device may be manufactured directly on the AlGaInN compliant substrate without growing the buffer layer on the sapphire wafer. Therefore, a manufacturing time for the device may be reduced.

Further, as the estimation of the compliant substrate is possible, a failure of the device due to a defect in the substrate may be reduced by providing a non-defective substrate as a base substrate of the semiconductor device such as the light emitting diode.

The invention claimed is:

1. A method for manufacturing a GaN based compound semiconductor device, comprising:
    providing a compliant substrate including a sapphire wafer and a $(Al_xGa_{1-x})_yIn_{1-y}N$ film on the sapphire substrate, the compliant substrate having a relived stress characteristic, where $0 \leq x \leq 1$, and $0 \leq y \leq 1$;
    forming a first GaN layer, an active layer, and a second GaN layer on the complaint substrate in sequence;
    forming a current spreading layer on the second GaN layer;
    removing a portion of the second GaN layer and a portion of the active layer to expose the first GaN layer corresponding to an n-type contact;
    removing a predetermined thickness of the exposed first GaN layer;
    forming a first electrode on the exposed first GaN layer; and
    forming a second electrode on the current spreading layer.

2. A semiconductor device manufactured according to the method of claim 1.

* * * * *

UNITED STATES PATENT AND TRADEMARK OFFICE
CERTIFICATE OF CORRECTION

PATENT NO.        : 7,795,118 B2                                     Page 1 of 1
APPLICATION NO.   : 11/989008
DATED             : September 14, 2010
INVENTOR(S)       : Yong Sung Jin et al.

It is certified that error appears in the above-identified patent and that said Letters Patent is hereby corrected as shown below:

Column 2, Line 2
Please delete "relived"
and replace with -- relieved --

Column 2, Line 4
Please delete "complaint"
and replace with -- compliant --

Column 8, Claim 1, Line 11
Please delete "relived"
and replace with -- relieved --

Signed and Sealed this

Twenty-third Day of November, 2010

David J. Kappos
*Director of the United States Patent and Trademark Office*